United States Patent
Town

(10) Patent No.: US 7,170,467 B1
(45) Date of Patent: Jan. 30, 2007

(54) ANTENNA COUPLERS AND METHOD OF PRODUCTION

(75) Inventor: Graham D. Town, Amherst, NH (US)

(73) Assignee: Bae Systems Information and Electronic Systems Integration Inc., Nashua, NH (US)

(*) Notice: Subject to any disclaimer, the term of this patent is extended or adjusted under 35 U.S.C. 154(b) by 3 days.

(21) Appl. No.: 10/543,252

(22) PCT Filed: Nov. 29, 2004

(86) PCT No.: PCT/US2004/040032

§ 371 (c)(1),
(2), (4) Date: Jul. 22, 2005

(87) PCT Pub. No.: WO2006/085832

PCT Pub. Date: Aug. 17, 2006

(51) Int. Cl.
G01R 29/10 (2006.01)
H01Q 1/50 (2006.01)
(52) U.S. Cl. .................. 343/906; 343/703; 343/705
(58) Field of Classification Search ............. 343/906, 343/703, 705, 708, 872; 455/67.11
See application file for complete search history.

(56) References Cited

U.S. PATENT DOCUMENTS

| 4,800,387 | A  | * | 1/1989  | Joy ........................ 342/165 |
| 5,432,523 | A  | * | 7/1995  | Simmers et al. ........... 343/703 |
| 6,329,953 | B1 | * | 12/2001 | McKivergan .............. 343/703 |
| 6,448,787 | B1 | * | 9/2002  | Oglesby ................... 324/612 |
| 6,469,673 | B2 | * | 10/2002 | Kaiponen ................. 343/703 |
| 6,489,931 | B2 | * | 12/2002 | Liu ......................... 343/786 |

* cited by examiner

Primary Examiner—Tan Ho
(74) Attorney, Agent, or Firm—Michael Sand; Daniel J. Long

(57) ABSTRACT

A method of producing an antenna coupler for placement on an antenna under test (AUT) having an aperture. This method includes the steps of constructing a probe from a section of RF hard-line stock having a center conductor and an outer conductor. The outer conductor is removed to expose a portion of the center conductor having a length equal to or less than ¼ wavelength of the AUT. The probe is embedded within a fiberglass shell and has an exposed RF connector for connection to equipment for performing tests on the AUT. The probe is then positioned across the aperture of the Antenna Under Test (AUT).

17 Claims, 2 Drawing Sheets

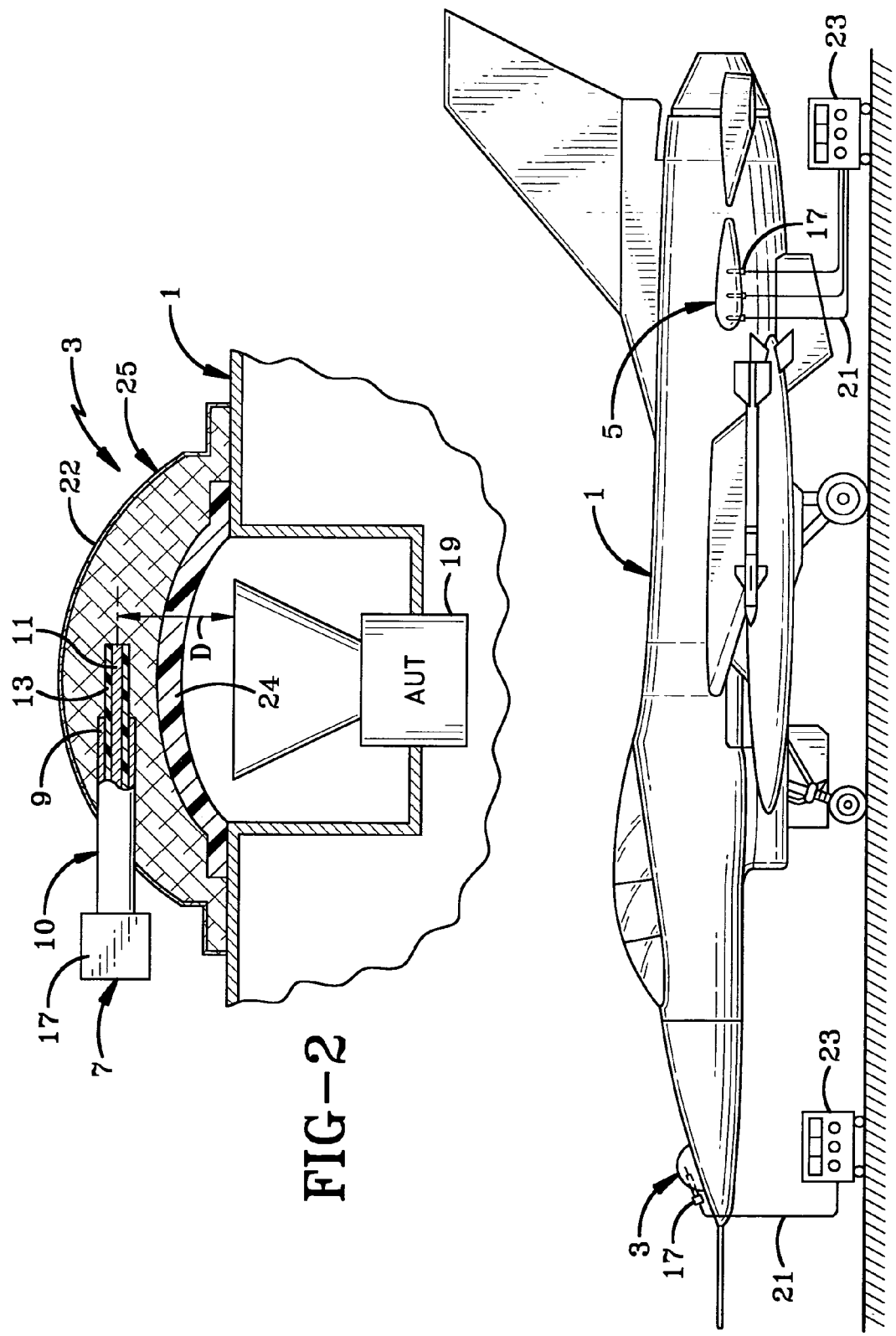

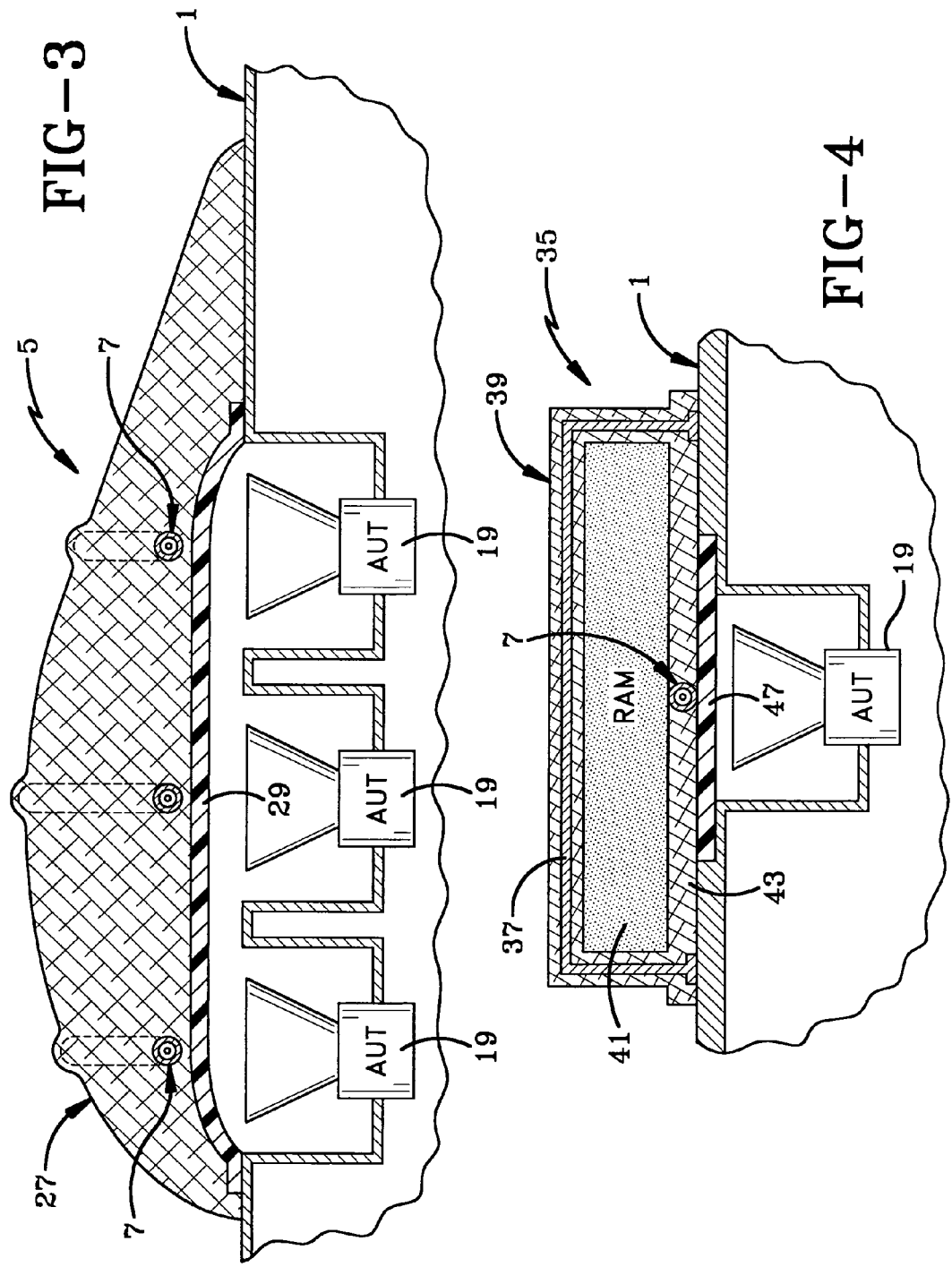

ANTENNA COUPLERS AND METHOD OF PRODUCTION

BACKGROUND OF THE INVENTION

This application is a 371 of PCT/US04/40032 filed on Nov. 29, 2004.

1. Technical Field

The present invention relates to antennas and more particularly to antenna couplers. Even more particularly, the invention relates to a quick check conformal antenna coupler which provides a reliable and repeatable RF interface between aircraft electronic countermeasure (ECM) system installations and flightline automated test equipment (ATE) without requiring the removal of aircraft radomes.

2. Background Information

Antenna couplers are devices used to match the impedance of a transmitter and/or receiver to an antenna to provide maximum power transfer. One of their uses is to provide the RF interface between an aircraft electronic countermeasure system (ECM) installation and flightline Automatic Test Equipment (ATE). Unlike most radar and communications systems, ECM systems typically operate over a wide range of frequencies, an octave or more is not uncommon. The interface must provide for a predictable and repeatable transfer function between the ATE and the System Under Test (SUT). Since this is an RF interface, the transfer function is described in terms of Voltage Standing Wave Ratio (VSWR), Insertion Loss (IL) and bandwidth (BW). Antenna couplers must also provide protection from interfering RF signals and security from disclosure of SUT performance parameters through unintentional broadcast of SUT/ATE emanations.

Antenna couplers for aircraft installed ECM Systems are required to perform "end to end" system testing. Antenna couplers have unique mechanical interfaces for each system antenna and antenna location. Antenna coupler sets are different for each aircraft type due to the physical differences between locations on different type aircraft. Also each aircraft generally will have a number of radar antennas protected by radomes, each of which heretofore had to be removed in order to perform the required tests requiring the use of relatively expensive and bulky test equipment. Also the locations of the radar antennas vary and are at locations, sometimes difficult to reach conveniently with such prior art heavy and bulky test equipment. Because of these design constraints existing antenna couplers are high cost items. Antenna couplers must also perform with high transmit power systems. Thus, antenna couplers for these applications tend to be rather large, expensive to use and maintain, and bulky to transport and store.

A need, therefore, exists for a low cost, compact size antenna coupler and a method for its production.

BRIEF SUMMARY OF THE INVENTION

The present invention is a low cost, compact size antenna coupler and a method for its production and use, which is based on reducing the size, complexity and cost of antenna couplers by employing a novel near-field sensing probe in place of the usual coupler antenna element. All currently deployed U.S. Air Force antenna couplers utilize commercially produced antennas as the coupling elements. A 2.5" broadband (2 to 18 GHz) Cavity Backed Spiral, similar to the antennas used for RWR quadrant receivers, is most commonly used. These antennas are well behaved over broad frequency ranges, are compact, and are widely available. A 2.5" Cavity Backed Spiral (AS-218 series, ≈2–8 GHz BW) built by BAE SYSTEMS Information and Electronic Systems Integration Inc. (IEWS) is widely used in BAE SYSTEMS IEWS designs as well as a smaller BAE SYSTEMS IEWS built 1.0" variant (AS-83 series, ≈6–16 GHz BW). Virtually all BAE SYSTEMS IEWS built Antenna Couplers use either an AS-218 or AS-83 series antenna.

One aspect of the present invention is to provide a quick check conformal antenna coupler which provides reliable, repeatable RF interfacing, a smaller footprint than traditional prior art couplers, and avoids the need to remove the aircraft radomes when performing tests on the enclosed radar.

Another feature of the invention is to provide an antenna coupler which is less than ⅓ the weight of existing couplers heretofore required to perform the required tests, and which can be formed at approximately ½ the cost of such prior art couplers.

A further aspect is to provide such a coupler which is formed of lightweight, durable fiberglass material, which is constructed to conform to the unique aircraft and radome profile on which it will be utilized, and which provides electromagnetic interference/electromagnetic compatibility (EMI/EMC) shielding and effective bandwidth.

Another aspect of the invention is that the antenna coupler can be mounted easily on an aircraft with or without auxiliary hardware or can be manually held in position while performing tests thereon.

The invention provides such an antenna coupler which can be a consumable end item, that is, it can be replaced due to its low cost and not repaired if damaged. This also avoids the need to store numerous repair parts, especially where space is at a premium, such as aboard a ship. Also it requires no complicated logistics to utilize the same.

BRIEF DESCRIPTION OF THE SEVERAL VIEWS OF THE DRAWINGS

The present invention is further described with reference to the accompanying drawing wherein:

FIG. 1 is a diagrammatic view of an aircraft having a pair of the antenna couplers of the present invention mounted thereon for performing flightline testing on the ECM system.

FIG. 2 is an enlarged cross-sectional diagrammatic view of a first embodiment of the antenna coupler mounted adjacent one of the aircraft antennas.

FIG. 3 is an enlarged cross-sectional diagrammatic view of a second embodiment of the antenna coupler mounted adjacent an array of the aircraft antennas.

FIG. 4 is a diagrammatic cross-sectional view of a third embodiment of the antenna coupler of the present invention.

Similar numbers refer to similar parts throughout the drawings.

DETAILED DESCRIPTION OF THE INVENTION

FIG. 1 is a diagrammatic perspective view of an aircraft indicated generally at 1, which is shown with two different embodiments of the antenna coupler of the present invention, indicated generally at 3 and 5, mounted thereon while testing. The first embodiment coupler 3 (FIG. 2) is a single antenna coupler wherein embodiment 5 (FIG. 3) is a multiple antenna coupler. The particular location and configuration of antennas 3 and 5 on aircraft 1 are merely representative of the various array of antenna couplers of the present invention, which can be utilized at various locations on the aircraft, with the embodiments shown in FIG. 1 being illustrative examples only.

The compact coupler concept of the present invention utilizes a specific type of probe in place of the commercially produced antenna-coupling element and is referred to as a Lowe probe, named after Ralph Lowe, who first used the probe in the highly successful US Navy AN/ALR-59 and AN/ALR-73 Passive Detection System (PDS) Antenna Couplers for the E-2C Hawkeye Aircraft. One example of the Lowe probe is indicated generally at 7, and is a quarter wave stub fabricated from a piece of 0.141" (0.36 cm) RF Hardline coaxial cable stock.

Probe 7 preferably is constructed from a section of RF hard-line stock 10 which is a heavy duty coaxial cable where the outside conductor is a rigid or semi-rigid pipe, rather than flexible and braided wire. Hard line stock has a low loss at high frequency and is usable even at high RF power levels. In a preferred embodiment, probe 7 is formed from a section of 0.141" (0.36 cm) diameter stock. The shield (outer conductor) 9, preferably is a rigid copper pipe and is cut back to expose a length of the center conductor 11 equal to or less than ¼ wavelength long. Center conductor 11 preferably is a solid metallic wire such as copper. This partial wave length stub acts as the coupling element. The RF line stock also will include a dielectric 13 which surrounds the probe center conductor 11 and maintains a spacing between inner conductor 11 and outer conductor 9 throughout the cable. An appropriate RF connector 17 is attached to the other end of the hard-line coaxial cable 10, which in turn is connected to a test cable 21 (FIG. 1), which extends to the usual test equipment 23 for performing the flightline tests on the ECM system. However, probe 7 can be constructed from different hard-line stocks depending upon the output power level and frequency range of the particular antenna and system to be tested thereby. For example, another usual hard-line stock has an outer diameter of approximately 0.086" (0.22 cm).

It has been demonstrated that probe 7 when placed across the aperture of an Antenna Under Test (AUT) 19 has little effect on the AUT VSWR, couples nicely with decent bandwidth and is virtually immune to high Effective Radiated Power (ERP). Although not critical to the invention, probe 7 appears to work best when located very close to the aperture plane of the AUT (spirals less than 3 cm, horns less than 10 cm) represented by distance "D", FIG. 2. Lateral position is not highly critical (tolerances of ±20 mm typical), but distance from AUT plane of aperture is more critical for spirals than horns. The probes are quite polarization sensitive.

In accordance with another feature of the invention, probe 7 is embedded in an antenna coupler shell indicated generally at 25. Shell 25 is constructed as a laminated structure, preferably layed-up sheets of fiberglass having a gel-coat cover layer 22 (FIG. 2). Probe 7 is embedded directly into the coupler shell so that it is positioned across the aperture of AUT 19 at the desired spacing as discussed above, when shell 25 is placed over the AUT. Furthermore, shell 25 is placed directly over and preferably conforms to radome 24 eliminating the removal of the radome as heretofore required greatly facilitating the testing procedures.

The second embodiment of the antenna coupler indicated at 5, is shown in detail in FIG. 3, and is similar in most respects to coupler 3 discussed above except that it includes a plurality or an array of individual probes 7 spaced from each other throughout a coupler shell 27. Shell 27 also is fabricated from laid-up sheets of fiberglass shaped so that it conforms to the shape of the aircraft, and in particular to the radome 29 thereof, so that probes 7 formed from coaxial cables 10, are located at the required distances from the apertures of the multiple AUT 19. Each of the coaxial cables 10 embedded in shell 27 have an RF connector 17 at the exposed ends thereof for connection to test equipment 23 as shown in FIG. 1.

A third embodiment is indicated generally at 35 (FIG. 4), and is similar to embodiments 3 and 5 discussed above with the exception that it includes a metallic screen 37 embedded within a dielectric shell 39 where it is separated from probe 7 by a layer of radar absorbent material (RAM) indicated at 41. Probe 7 will be embedded within an innermost layer 43 of the fiberglass so as to be at the correct spacing from the aperture of an AUT 19. Again, as shown in FIG. 4, dielectric shell 39 is placed over an aircraft radome 47 eliminating the need for removal of the same as required in prior tests. Also, a gel-coat layer (not shown) may be placed over the layers of fiberglass in forming the finalized dielectric shell 39.

As discussed above, probe 7 shown in the various embodiments will have an exposed center conductor equal to or less than ¼ wavelength at the low end of the operating frequency range of the aperture of the AUT. As examples, a 500 MHz antenna signal will have a ¼ wavelength of 15 cm, a 900 MHz signal will have a ¼ wavelength of 8.3 cm, a 2 GHz signal will have a wavelength of 3.75 cm, a 9 GHz signal will have ¼ wavelength of 0.83 cm, and a 15 GHz signal will have ¼ wavelength of 0.5 cm. Again, the position of probe 7 will be fine tuned to provide the most accurate coupling by its location within the outer fiberglass shell. Careful placement of the probe 7 may enhance or diminish it's sensitivity to AUT polarization as required for the specific application.

Dielectric shells 25, 27, and 39 will have various configurations designed to match the specific shape of the radome if one is used with the particular antenna as shown in FIGS. 2–4. For certain types of antennas, for example, a blade antenna which projects from the aircraft skin will not have a radome. For these types of antennas, the formed fiberglass shell will conform sufficiently to the antenna so that probe 7 when embedded therein, will have the desired distance from the antenna aperture, that is, a distance equal to or less than ¼ wavelength of the antenna signal of the AUT. The shells can have various attachment devices (not shown) secured to the shell, which depending upon the antenna being tested, can be secured to the aircraft frame, or the coupler can be held in position manually over the radome or antenna while the tests are being performed thereon. The outer shell can be formed of other types of dielectric materials other than fiberglass if desired, without affecting the concept of the invention. However, fiberglass is believed best due to its low cost and well known and established methods for manufacturing the various shapes required due to the vast number and different radome configurations.

While the present invention has been described in connection with the preferred embodiments of the various figures, it is to be understood that other similar embodiments may be used or modifications and additions may be made to the described embodiment for performing the same function of the present invention without deviating therefrom. Therefore, the present invention should not be limited to any single embodiment, but rather construed in breadth and scope in accordance with the recitation of the appended claims.

The invention claimed is:

1. A method of producing an antenna coupler for mounting on an Antenna Under Test (AUT) having an aperture, said method comprising the steps of:
   constructing a probe from a section of RF hard-line stock having a center conductor and an outer conductor by removing a part of the outer conductor to expose a portion of the center conductor having a length equal to or less than ¼ wavelength of the Antenna Under Test (AUT); and
   positioning said probe across the aperture of the Antenna Under Test (AUT).

2. The method defined in claim 1 including the step of embedding the probe within a shell of a dielectric material.

3. The method defined in claim 2 including the step of constructing the shell of fiberglass.

4. The method defined in claim 3 including the step of coating the fiberglass shell with a gel-coat.

5. The method defined in claim 2 including the step of placing the shell over a radome protecting the AUT.

6. The method defined in claim 2 including the step of embedding a metallic screen in the shell.

7. The method defined in claim 2 including the step of embedding a plurality of the probes in a spaced relationship within the shell; and positioning said probes across the apertures of a plurality of spaced AUT.

8. The method defined in claim 2 including the step of exposing the center conductor whereby the length is ¼ wavelength of the AUT.

9. The method defined in claim 2 including the steps of embedding a metallic screen in the shell; and placing a layer of a radar absorbent material between the metallic screen and probe.

10. The method defined in claim 1 including the steps of forming the outer conductor of the probe of a copper pipe and forming the inner conductor of a solid wire; and providing a layer of dielectric material surrounding the inner conductor.

11. The method defined in claim 1 including the step of placing the probe less than 10 cm from the aperture of the AUT.

12. An antenna coupler for placement over an antenna under test (AUT) of an aircraft for RF interfacing with the antenna, said coupler comprising:
   a shell formed of a dielectric material;
   a probe formed of a hard line coaxial cable contained within said shell, said cable having an outer conductor and an inner conductor separated by a dielectric, said inner conductor extending beyond said outer conductor a length equal to or less than ¼ wavelength of the AUT at one end of the cable; and
   an RF connector at another end of said cable for connecting said probe to flightline Automatic Test Equipment (ATE).

13. The coupler defined in claim 12 wherein the shell is constructed of fiberglass and the probe is embedded therein.

14. The coupler defined in claim 13 wherein a metallic screen is embedded in the shell and separated from the probe by radar absorbent material.

15. The coupler defined in claim 12 wherein the outer conductor of the coaxial cable is a copper pipe and the inner conductor is a solid wire.

16. The coupler defined in claim 12 wherein a plurality of the probes are contained in the shell in a spaced relationship from each other.

17. The coupler defined in claim 12 wherein the shell is coated with an outer gel-coat of material.

* * * * *